United States Patent
Halliday et al.

(10) Patent No.: US 11,935,188 B2
(45) Date of Patent: Mar. 19, 2024

(54) 3D BUILDING ANALYZER

(71) Applicant: Hover Inc., San Francisco, CA (US)

(72) Inventors: Derek Halliday, Oakland, CA (US); Antonio Carlos Marques da Silva Junior, Concord, CA (US); Roberto Klein, Oakland, CA (US); Adam J. Altman, San Francisco, CA (US)

(73) Assignee: Hover Inc., San Francisco, CA (US)

( * ) Notice: Subject to any disclaimer, the term of this patent is extended or adjusted under 35 U.S.C. 154(b) by 0 days.

(21) Appl. No.: 18/306,775

(22) Filed: Apr. 25, 2023

(65) Prior Publication Data

US 2023/0260212 A1 Aug. 17, 2023

Related U.S. Application Data

(63) Continuation of application No. 17/583,546, filed on Jan. 25, 2022, now Pat. No. 11,670,046, which is a
(Continued)

(51) Int. Cl.
  *G06T 17/00* (2006.01)
  *G06F 3/14* (2006.01)
  (Continued)

(52) U.S. Cl.
  CPC .............. *G06T 17/00* (2013.01); *G06F 3/14* (2013.01); *G06F 30/13* (2020.01); *G06F 30/23* (2020.01);
  (Continued)

(58) Field of Classification Search
  None
  See application file for complete search history.

(56) References Cited

U.S. PATENT DOCUMENTS 5,189,606 A 2/1993 Burns et al.
5,973,697 A 10/1999 Berry et al.
(Continued)

FOREIGN PATENT DOCUMENTS

WO WO2007147830 A1 12/2007
WO WO2011079241 A1 6/2011
WO WO2011091552 A1 8/2011

OTHER PUBLICATIONS

Bansal, et al., "Geo-Localization of Street Views with Aerial Image Databases," Nov. 28-Dec. 1, 2011, pp. 1125-1128.
(Continued)

*Primary Examiner* — Kent W Chang
*Assistant Examiner* — Jonathan M Cofino

(57) ABSTRACT

A system and method is provided for constructing a labeled and dimensioned multidimensional (e.g., 3D) building model from building object imagery (e.g., ground-level imagery). The method begins by retrieve building object imagery, the building object imagery collected based on directed capture with a mobile device. The method continues by constructing a scaled multi-dimensional building model, the scale based on sizing of at least one selected architectural feature. The method continues by identifying architectural elements within facades of the multi-dimensional building model. The method continues by determining dimensions of at least one of the architectural elements, the dimensions based on the scale. The method continues by determining dimensions (e.g., area) of at least one of the architectural elements. The method continues by labeling each identified architectural element with at least an identifier and by labeling at least one of the architectural elements with the determined dimensions.

20 Claims, 16 Drawing Sheets

Related U.S. Application Data continuation of application No. 17/127,994, filed on Dec. 18, 2020, now Pat. No. 11,276,229, which is a continuation of application No. 16/998,564, filed on Aug. 20, 2020, now Pat. No. 10,902,672, which is a continuation of application No. 15/411,226, filed on Jan. 20, 2017, now Pat. No. 10,861,224, which is a continuation-in-part of application No. 15/255,807, filed on Sep. 2, 2016, now Pat. No. 10,776,999, which is a continuation of application No. 14/339,127, filed on Jul. 23, 2014, now Pat. No. 9,437,033.

(60) Provisional application No. 61/857,302, filed on Jul. 23, 2013.

(51) Int. Cl.
| | | |
|---|---|---|
| *G06F 30/13* | (2020.01) | |
| *G06F 30/23* | (2020.01) | |
| *G06T 15/04* | (2011.01) | |
| *G06T 15/20* | (2011.01) | |
| *G06T 17/05* | (2011.01) | |
| *G06T 19/00* | (2011.01) | |
| *G06T 19/20* | (2011.01) | |
| *G06V 20/10* | (2022.01) | |
| *G06V 20/64* | (2022.01) | |

(52) U.S. Cl.
CPC .............. *G06T 15/04* (2013.01); *G06T 15/20* (2013.01); *G06T 17/05* (2013.01); *G06T 19/003* (2013.01); *G06T 19/20* (2013.01); *G06V 20/176* (2022.01); *G06V 20/653* (2022.01); *G06T 2200/08* (2013.01); *G06T 2200/24* (2013.01); *G06T 2207/10028* (2013.01); *G06T 2210/04* (2013.01); *G06T 2210/56* (2013.01); *G06T 2219/004* (2013.01); *G06T 2219/2008* (2013.01); *G06T 2219/2016* (2013.01)

(56) References Cited

U.S. PATENT DOCUMENTS

| | | | |
|---|---|---|---|
| 7,218,318 | B2 | 5/2007 | Shimazu |
| 7,814,436 | B2 | 10/2010 | Schrag et al. |
| 7,978,937 | B2 | 7/2011 | Abernethy et al. |
| 8,040,343 | B2 | 10/2011 | Kickuchi et al. |
| 8,098,899 | B2 | 1/2012 | Ohashi |
| 8,139,111 | B2 | 3/2012 | Oldroyd |
| 8,339,394 | B1 | 12/2012 | Lininger |
| 8,350,850 | B2 | 1/2013 | Steedly et al. |
| 8,390,617 | B1 | 3/2013 | Reinhardt |
| 8,666,158 | B2 | 3/2014 | Strassenburg-Kleciak |
| 8,878,877 | B2 | 11/2014 | Bhosale et al. |
| 2003/0014224 | A1 | 1/2003 | Guo et al. |
| 2004/0196282 | A1 | 10/2004 | Oh |
| 2007/0070069 | A1 | 3/2007 | Samarasekera et al. |
| 2007/0168153 | A1 | 7/2007 | Minor |
| 2008/0112610 | A1 | 5/2008 | Israelsen et al. |
| 2008/0221843 | A1 | 9/2008 | Shenkar et al. |
| 2009/0316951 | A1 | 12/2009 | Soderstrom |
| 2010/0045869 | A1 | 2/2010 | Basely et al. |
| 2010/0074532 | A1 | 3/2010 | Gordon et al. |
| 2011/0029897 | A1 | 2/2011 | Russell |
| 2011/0181589 | A1 | 7/2011 | Quan et al. |
| 2012/0051627 | A1 | 3/2012 | Marraud |
| 2013/0202197 | A1 | 8/2013 | Reeler et al. |
| 2013/0257856 | A1 | 10/2013 | Hickman et al. |
| 2014/0023996 | A1 | 1/2014 | Finn et al. |
| 2014/0193039 | A1 | 12/2014 | Wexler |

OTHER PUBLICATIONS

Becker, et al., "Semiautomatic 3-D model extraction from uncalibrated 2-D camera views," MIT Media Laboratory, 15 pages.

Chen, et al., "City-Scale Landmark Identification on Mobile Devices," pp. 737-744.

Fruh and Zakhor, "Constructing 3D City Models by Merging Aerial and Ground Views," IEEE Computer Graphics and Applications, Nov./Dec. 2003, pp. 52-61, 10 pages.

Huang and Wu, et al., "Towards 3D City Modeling through Combining Ground Level Panoramic and Orthogonal Aerial Imagery," 2011 Workshop on Digital Media and Digital Content Management, pp. 66-71, 6 pages.

Jaynes, "View Alignment of Aerial and Terrestrial Imagery in Urban Environments," Springer-Verlag Berlin Heidelber1 1999, pp. 3-19, 17 pages.

Kroepfl, et al., "Efficiently Localing Photographs in Many Panoramas," Nov. 2-5, 2010, ACM GIS'10.

Lee, et al., "Automatic Integration of Facade Textures into 3D Building Models with a Projective Geometry Based Line :;lustering," Eurographics 2002, vol. 2, No. 3, 10 pages.

Lee, et al., "Integrating Ground and Aerial Views for Urban Site Modeling," 2002, 6 pages.

Pu et al., "Automatic Extraction of Building Features From Terrestrial Laser Scanning," International Institute for Geo-Information Science and Earth Observation, 5 pages.

Wang, et al.; Large-Scale Urban Modeling by Combining Ground Level Panoramic and Aerial Imagery; IEEE Third International Symposium on 3D Data Processing, Visualization, and Transmission; Jun. 14-16, 2006; pp. 806-813.

Xiao, et al., "Image-based Facade Modeling," ACM Transaction on Graphics {TOG), 2008, 10 pages.

Murillo, et al. Visual Door Detection Integrating Appearance and Shape Cues, Robotics and Autonomous Systems, vol. 56, Issue 6, Jun. 30, 2008 pp. 512-521.

| Facade | Siding Area | Inside Corners | Outside Corners | Windows | Shutters |
|---|---|---|---|---|---|
| A | 141 ft² | 1 | 1 | 4 | 0 |
| B | 97 ft² | 1 | 1 | 2 | 0 |
| C | 63 ft² | 0 | 2 | 1 | 0 |
| D | 63 ft² | 0 | 2 | 1 | 0 |
| E | 18 ft² | 0 | 0 | 0 | 0 |
| F | 270 ft² | 2 | 2 | 2 | 0 |
| G | 138 ft² | 1 | 3 | 2 | 0 |
| H | 45 ft² | 0 | 2 | 8 | 0 |
| I | 108 ft² | 1 | 1 | 0 | 0 |
| J | 98 ft² | 3 | 2 | 0 | 0 |
| K | 283 ft² | 1 | 1 | 2 | 0 |
| L | 138 ft² | 0 | 3 | 3 | 0 |
| M | 17 ft² | 2 | 1 | 0 | 0 |
| N | 13 ft² | 0 | 1 | 0 | 0 |
| O | 0 ft² | 0 | 1 | 0 | 0 |
| P | 0 ft² | 0 | 1 | 0 | 0 |
| Q | 20 ft² | 1 | 1 | 2 | 0 |
| S | 174 ft² | 0 | 2 | 2 | 0 |
| T | 31 ft² | 3 | 1 | 0 | 0 |

Total Quantities:

| Item | Quanitity |
|---|---|
| Inside Corners | 24 |
| Windows (siding/total) | 53 (58) |

| Item | Quanitity |
|---|---|
| Outside Corners | 30 |
| Shutters | 0 |

Total Lengths:

| Type | Length |
|---|---|
| Level Base | 471'8" |
| Inside Corners | 143'5" |
| Eave Lines | 361'4" |
| Windows Tops Perim. | 139'1" |
| Windows sides Perim. | 379'10" |

| Type | Length |
|---|---|
| Sloped Base | 100'10" |
| Outside Corners | 208'5" |
| Rake Lines | 256'10" |
| Windows Bottoms Perim. | 139'1" |
| | - |

Total Areas:

| Substrate | Square Ft |
|---|---|
| Siding | 4080 ft² |

FIG. 12

3D BUILDING ANALYZER

CROSS-REFERENCE TO RELATED APPLICATIONS

The present U.S. Utility Patent Application claims priority pursuant to 35 U.S.C. § 120 as a continuation of U.S. Utility application Ser. No. 17/583,546, entitled "3D BUILDING ANALYZER," filed Jan. 25, 2022, which is a continuation of U.S. Utility application Ser. No. 17/127,994, entitled "3D BUILDING ANALYZER," filed Dec. 18, 2020, now U.S. Pat. No. 11,276,229, which is a continuation of U.S. Utility application Ser. No. 16/998,564, entitled, "3D BUILDING ANALYZER," filed Aug. 20, 2020, now U.S. Pat. No. 10,902,672, which is a continuation of U.S. patent application Ser. No. 15/411,226, entitled "3D BUILDING ANALYZER," filed Jan. 20, 2017, now U.S. Pat. No. 10,861,224, which is a continuation-in-part of U.S. Utility application Ser. No. 15/255,807, entitled "GENERATING MULTI-DIMENSIONAL BUILDING MODELS WITH GROUND LEVEL IMAGES," filed Sep. 2, 2016, now U.S. Pat. No. 10,776,999, which is a continuation of U.S. Utility application Ser. No. 14/339,127, entitled "GENERATING 3D BUILDING MODELS WITH GROUND LEVEL AND ORTHOGONAL IMAGES," filed Jul. 23, 2014, now U.S. Pat. No. 9,437,033, which claims priority pursuant to 35 U.S.C. § 119(e) to U.S. Provisional Application No. 61/857,302, entitled "GENERATING 3D BUILDING MODELS WITH GROUND LEVEL AND ORTHOGONAL IMAGES," filed Jul. 23, 2013, all of which are hereby incorporated herein by reference in their entirety and made part of the present U.S. Utility Patent Application for all purposes.

This application makes reference to the complete subject matter of U.S. Pat. Nos. 9,478,031, 8,878,865 and 8,422,825 each of which are incorporated herein by reference in their entirety.

BACKGROUND

Technical Field

The technology described herein relates generally to a system and method for analyzing multi-dimensional building models, and in particular, to a system and method creating a 3D blueprint based on the analyzing.

Description of Related Art

Some efforts have been made to generate accurate 3D textured models of buildings via aerial imagery or specialized camera-equipped vehicles. However, these 3D maps have limited texture resolution, geometry quality, accurate geo-referencing and are expensive, time consuming and difficult to update and provide no robust real-time image data analytics for various consumer and commercial use cases.

BRIEF DESCRIPTION OF THE DRAWINGS

FIG. 10 illustrates an embodiment of a siding listing for identified various known architectural elements, façades and dimensions of a multi-dimensional building model in accordance with the present disclosure;

FIG. 11 illustrates another embodiment of a siding listing for identified various known architectural elements, façades and dimensions of a multi-dimensional building model in accordance with the present disclosure;

FIG. 12 illustrates an embodiment of a summary siding listing for identified various known architectural elements, façades and dimensions of a multi-dimensional building model in accordance with the present disclosure;

DETAILED DESCRIPTION

Figure 1:
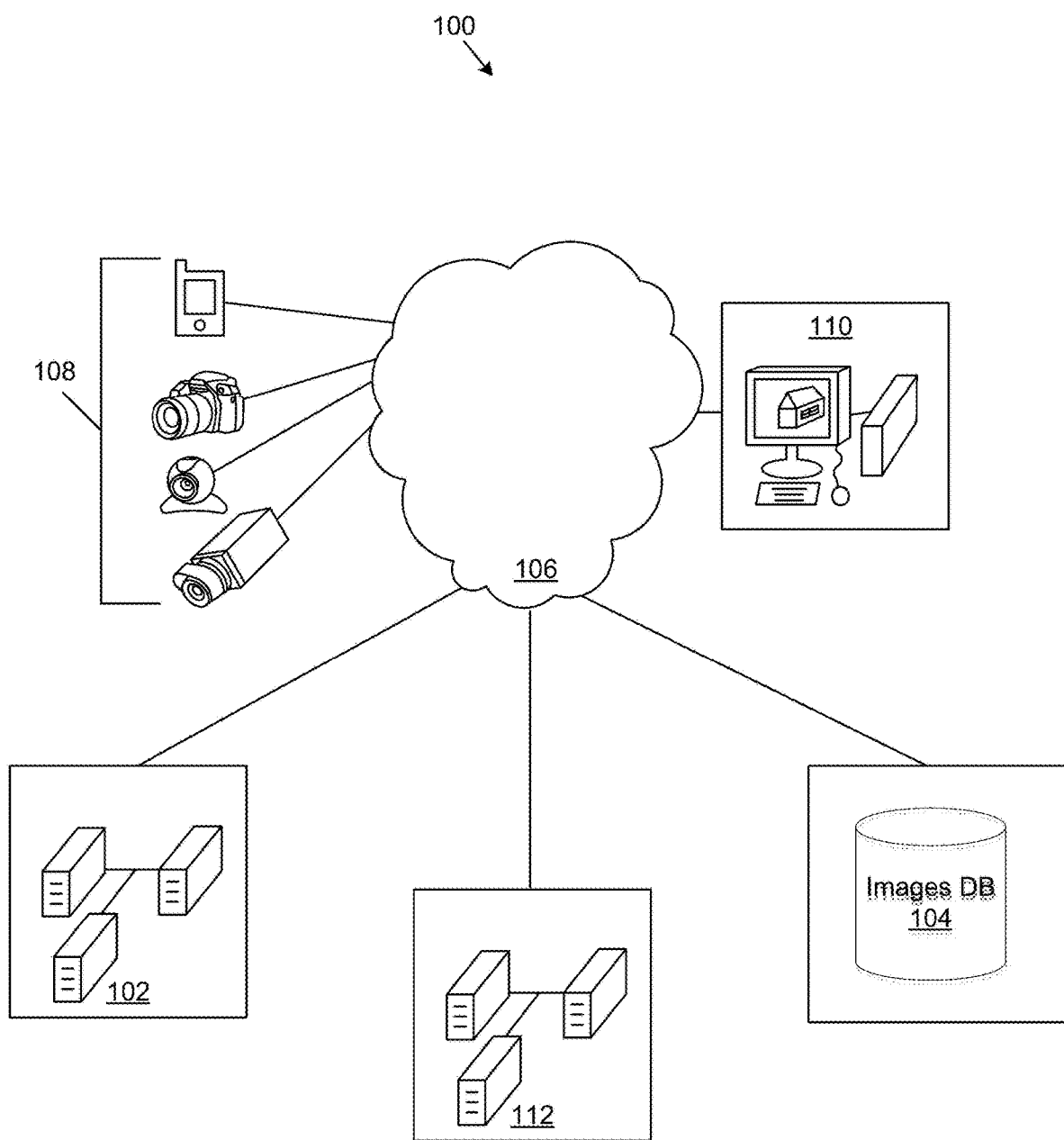
FIG. 1 illustrates one embodiment of a system architecture in accordance with the present disclosure.

FIG. 1 illustrates one embodiment of system architecture in accordance with the present disclosure. In one embodiment, image processing system 100 includes image processing servers 102/112. Image database (DB) 104 and image processing servers 102/112 are coupled via a network channel 106.

Network channel 106 is a system for communication. Network channel 106 includes, for example, an Ethernet or other wire-based network or a wireless NIC (WNIC) or wireless adapter for communicating with a wireless network, such as a WI-FI network. In other embodiments, network channel 106 includes any suitable network for any suitable communication interface. As an example and not by way of limitation, the network channel 106 can include an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As another example, network channel 106 can be a wireless PAN (WPAN) (such as, for example, a BLUETOOTH WPAN), a WI-FI network, a WI-MAX network, a 3G or 4G network, LTE, a cellular telephone network (such as, for example, a Global System for Mobile Communications (GSM) network).

In one embodiment, network channel 106 uses standard communications technologies and/or protocols. Thus, network channel 106 can include links using technologies such as Ethernet, 802.11, worldwide interoperability for microwave access (WiMAX), 3G, 4G, LTE, CDMA, digital subscriber line (DSL), etc. Similarly, the networking protocols used on network channel 106 can include multiprotocol label switching (MPLS), the transmission control protocol/Internet protocol (TCP/IP), the User Datagram Protocol (UDP), the hypertext transport protocol (HTTP), the simple mail transfer protocol (SMTP), and the file transfer protocol (FTP). In one embodiment, the data exchanged over network channel 106 is represented using technologies and/or formats including the hypertext markup language (HTML) and the extensible markup language (XML). In addition, all or some of links can be encrypted using conventional encryption technologies such as secure sockets layer (SSL), transport layer security (TLS), and Internet Protocol security (IPsec).

In one or more embodiments, image processing servers 102/112 include suitable hardware/software in the form of circuitry, logic gates, and/or code functions to process building object imagery (e.g., ground-level images) to include, but not limited to, multi-dimensional model building, calculation of one or more image measurements and production of a building material/feature listing. Capture device(s) 108 is in communication with image processing servers 102 for collecting, for example, ground-level images of building objects. Capture devices 108 are defined as electronic devices for capturing images. For example, the capture devices include, but are not limited to: a camera, a phone, a smartphone, a tablet, a video camera, a security camera, a closed-circuit television camera, a drone mounted camera system, a computer, a laptop, a webcam, wearable camera devices, photosensitive sensors, IR sensors, lasers, equivalents or any combination thereof.

Image processing system 100 also provides for viewer device 110 that is defined as a display device. For example, viewer device 110 can be a computer with a monitor, a smartphone, a tablet, a laptop, a touch screen display, a LED array, a television set, a projector display, a remote display coupled to the capture device, a wearable system with a display, or any combination thereof. In one or more embodiments, the viewer device includes display of one or more building façades and associated measurements, such as, for example, a conventional desktop personal computer having input devices such as a mouse, keyboard, joystick, or other such input devices enabling the input of data and interaction with the displayed images and associated measurements.

In one embodiment, an image processing system is provided for uploading to image processing servers 102 building object imagery (e.g., ground-level images) of a physical building from a capture device 108. An uploaded image is, for example, a digital photograph of a physical building, for example, showing a corner with one or more sides of the physical building.

Figure 2:
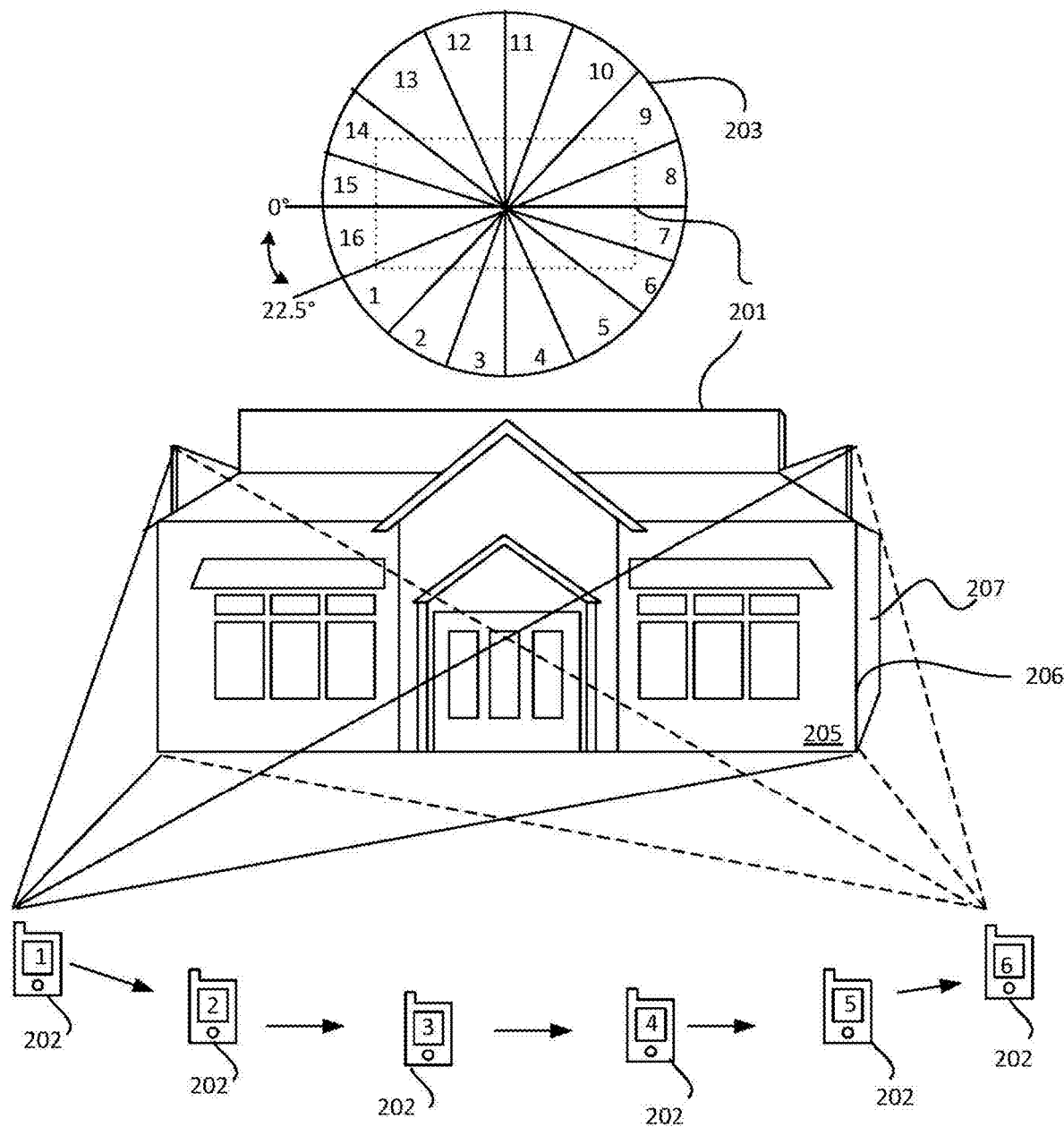
FIG. 2 illustrates an embodiment of a diagram for directed capture of ground-level images for a multi-dimensional building model in accordance with the present disclosure.

FIG. 2 illustrates an example of collecting ground-level images for building 200 in accordance with the present disclosure. Ground-level images 1-N displayed (e.g., in digital view finder), generated by capture device 108, provide for different perspectives of the building (in the illustrated example—centered on the façade). Ground-level images are taken to capture the building from multiple perspectives by panning (moving the camera source 108), for example, left-to-right (counter clockwise) starting with, for example, the façade 201 of the building (but not limited thereto). As shown, ground level images are captured as the capture device moves around the building—taking a plurality (e.g., 4-16 for an entire building) of ground level images from multiple angles, heights, and distances. The series of captured ground level images will be uploaded to image processing servers 102 to be instantiated as a 2D/3D building model and returned to the user for storage/display. While shown for ground-level image capture, vehicle mounted systems or a camera mounted on a drone can perform image capture.

As shown, ground-level image 202(1) provides for the left most building façade perspective relative to the other ground-level images. Ground-level image 202(6) provides for the right most building façade perspective relative to the other ground-level images. Ground-level images 202(2) through 202(5) represent the building façade from four additional perspectives between ground-level images 202(1) and 202(6). While shown as 6 images of the front façade 201 of the building, the user continues around the building taking photos as suggested by, for example, guide overlays until the building is captured (e.g., shown as 16 sectors 203). The number of image captures may vary with each building capture without departing from the scope of the technology described herein. However, in one embodiment, captures including four corners (e.g., 206) as well as four sides (e.g., front façade 201, right façade (side 207), back façade and left façade, etc.) may provide greater building image capture coverage (e.g., capture corners, boundaries and façades). In various embodiments, the roof is also captured as part of the ground-level captures or as part of a separate elevated capture method (e.g., drone, ladder, etc.).

Figure 3:
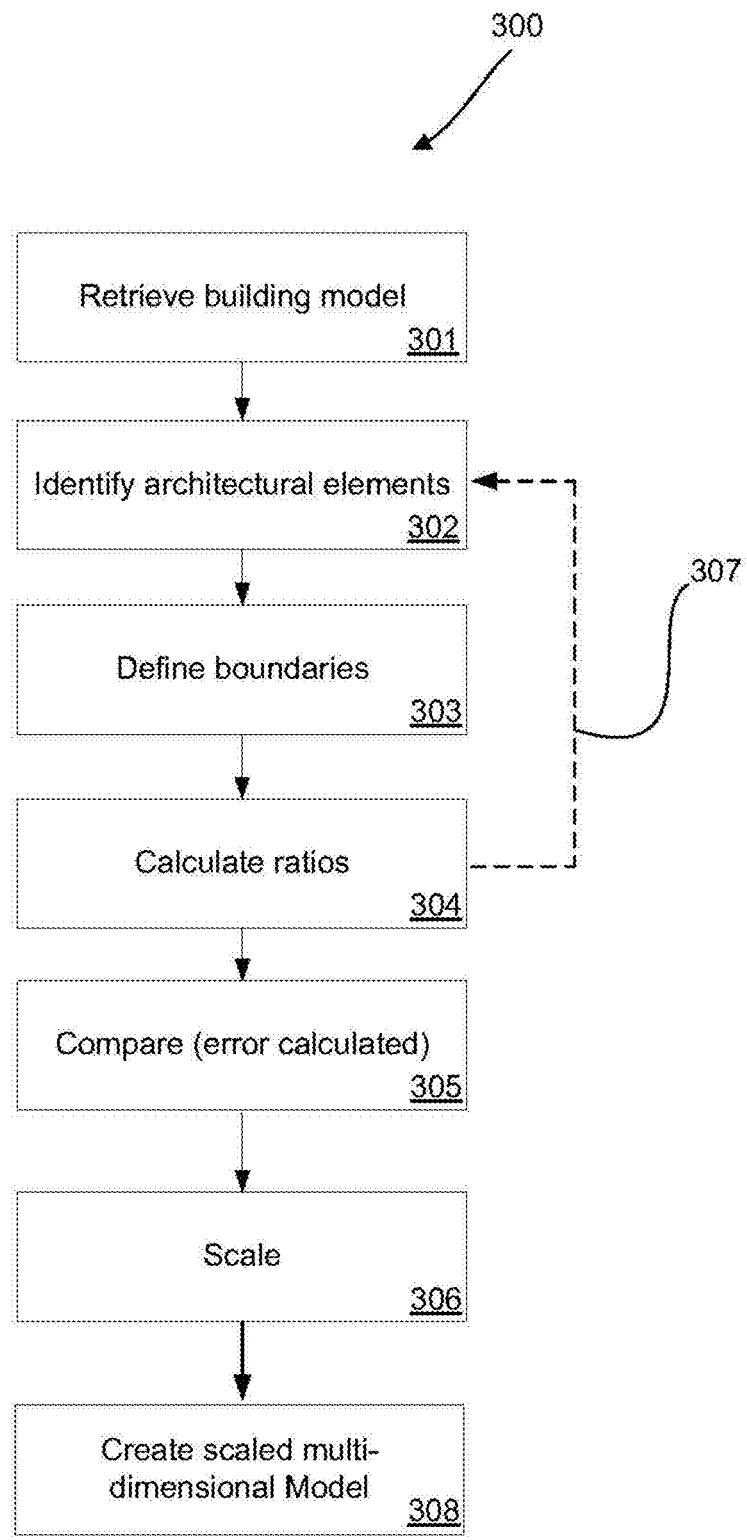
FIG. 3 illustrates an embodiment of a flowchart for identifying various known architectural elements, façades and dimensions of a multi-dimensional building model in accordance with the present disclosure.

FIG. 3 illustrates a flowchart 300 representing one embodiment process for accurately scaling a multi-dimensional model during construction thereof in accordance with the present disclosure. While shown for scaling during construction, scaling can be performed on the fly (in real time) as building object imagery (e.g., ground-level images) is captured, post capture, post multi-dimensional model construction or performed to rescale a previously scaled multi-dimensional model without departing from the scope of the technology disclosed herein.

In step 301, at least one ground-level image (imagery) is retrieved from images DB 104 to potentially identify dimensions (e.g., at least a partial façade image). In one embodiment, while a complete façade image offers a large number of scaling options, only a portion of the ground-level image may be necessary to scale. For example, when using a single architectural element to scale, the entire image (façade) may not be needed (only a portion including the selected architectural feature).

In one example embodiment, a front façade includes a cut-out of a full 2D image that has been rectified and correlated to vertices of geometric planes/polygons that make up a portion of, for example, a 3D model. The portion may be a close up of the front porch of a house that includes an exterior front door. In step 302, known architectural elements of the ground-level image are identified. In one embodiment, architectural elements are identified using known image or object recognition techniques, including known techniques, such as those shown in U.S. application Ser. No. 14/610,850, which is incorporated herein by reference.

In alternative embodiments, the identification of architectural elements is accomplished using other approaches. For example, perimeter boundaries are automatically identified using known line detection techniques. For another example, boundaries are identified using unique feature detection methods that look for repeated, consistent parallel lines or line intersections (patterns). For yet another example, boundaries of architectural elements are detected by comparison to previously stored libraries of known architectural elements. For yet another example, boundaries of architectural elements are detected using deep learning algorithms based on training using large ground training image sets (for example, a thousand images of a front façade image with one or more known architectural features is used to train the system to detect such façades with such features). For yet another example, boundaries are manually marked up (e.g., by human observer). The specific method of architectural element boundary detection may vary using other known and future techniques without departing from the scope of the present technology disclosed herein.

In step 303, perimeter boundaries for the identified architectural element(s) are defined by correlating, for example, perimeter points, vertices, corner points, edges or specific salient pixels (e.g., neighboring pixels with noted changes in contrast, density or color, side pixels, corner pixels, etc.) of the defined architectural element within the ground-based image to the corresponding boundaries (represented by x, y, z positions) within the 3D building model (e.g., within two images having a common element). Pixel positions are extrapolated from vertices/edges of the ground-level image.

In step 304, dimensional ratios of distances spanning the width and length of the identified architectural element are determined using, for example, image processing system 100 of FIG. 1. Since, in this example embodiment, real-world positions (i.e., geo-references) of the vertices/edges of the ground-level image are not known, scale is determined by determining dimensional ratios (e.g., height-to-width, width-to-height or area (width×height)) of selected architectural elements within their defined image boundaries (e.g., identified front exterior door) in the ground-level image. In another embodiment, the process is repeated 307 to determine dimensional ratios for pluralities of determined image boundaries in one or more multiple architectural elements. In this embodiment, the resulting ratios are later blended or averaged to determine a ratio (discussed in greater detail hereafter). For example, ratios for multiple doors can be calculated and then averaged or ratios for multiple different architectural elements averaged.

In step 305, determined ratios are compared to known standard architectural element dimensional ratios (width-to-height, width-to-height or area). The comparison may be as simple as selecting a dimensional ratio which is closest to a known standard architectural dimensional ratio. For example, some standard front doors are 36×80 inches.

In an alternative embodiment for step 305, an error threshold accounts for inherent inaccuracy in the imagery and provides a likely range of values that are used to correlate a ratio value to known standard architectural element dimensional ratios. For example, if the known architectural standard ratio of width-to-height for an exterior front door is 9:20 (0.45), the threshold will be established using, for example, ±05% (0.0225). If the determined ratio of the identified architectural element (door) falls within the range of 0.4275-0.4725, it is assumed that the determined ratio is likely to be the known architectural standard dimensional ratio for this door. If the determined ratio fails to fall within the threshold, it is assumed that it does not apply to the known architectural standard or it is from a different standard dimensional ratio for a different exterior front door size (e.g., 30×82 inches). An exterior door ratio which substantially matches a ratio of 9:20 reveals that the identified exterior front door is 36×80 inches.

By selecting a dimensional ratio closest to the respective known architectural element dimensional ratios, a proper scale can be determined for the ground-level image based on relative error of the selected dimensional ratio to the known dimensional ratio of the known architectural element. This error is used to scale the multi-dimensional building model accordingly (during or after construction). For example, the error could be ±1%, etc.

In a similar process to the previously discussed embodiment of using exterior front doors as the known architectural standard, a brick's height and width is used to identify dimensional ratios. Because bricks are smaller and a single image may contain many bricks, an average of a plurality of determined ratios may provide a higher accuracy. Therefore, pluralities of bricks are identified and their dimensional ratios determined. An average ratio is then compared to known brick architectural standard dimensional ratios. Error threshold values may be established for differing brick types and a comparison made between the average ratio value and the known architectural standard dimensional ratio, including the threshold. A brick's width-to-height or height-to-width ratio may be compared against known dimensional architectural standard ratios.

In step 306, the ratio which is closest to a known standard architectural element dimensional ratio is used as a scale. And in step 308, the scale is used to scale/rescale a multi-dimensional (e.g., 2D/3D) building model. Once one or more actual dimensions are known in the retrieved ground-level model, the remaining model scaling used during multi-dimensional model construction is scaled accordingly (same scale). In one embodiment, scale is determined for at least one façade or architectural feature (e.g., door). In another embodiment, scale may be determined for each separate side (façade) of a building and each side scaled accordingly. In another embodiment, scale may be determined for each side (façade) of a building and an average scaling used. In another embodiment, multiple architectural elements are identified and ratios calculated with the closest (least error) ratio selected from a group of determined ratios. In another embodiment, an already constructed multi-dimensional model uses scale of at least one edge. Once the edge has an accurate dimension (using the technology described herein), the dimensions and position of the remaining edges (and vertices) are adjusted accordingly to maintain the original geometry (angles of the vertices and the length ratios of the edges) of the building model. Once a scaled building model has been constructed, the building model can be textured based on the ground-level images with the original coordinates for textures.

In one embodiment, the repeated comparison between the ratios of multiple selections of an architectural element (e.g., door ratios in various doors located within the image) and the known architectural standard dimensions established in step 302 is fed into a weighted decision engine (not shown)

to determine an average ratio determination. The weighted decision engine in uses learned statistical analysis to improve scaling over time and measurements. As more statistical information is accumulated (learned), the weighted decision engine creates a more predictable result. Again, in step 306, the multi-dimensional building model is scaled and constructed 308 (or rescaled) according to the decision determined by the weighted decision engine.

Figure 4:
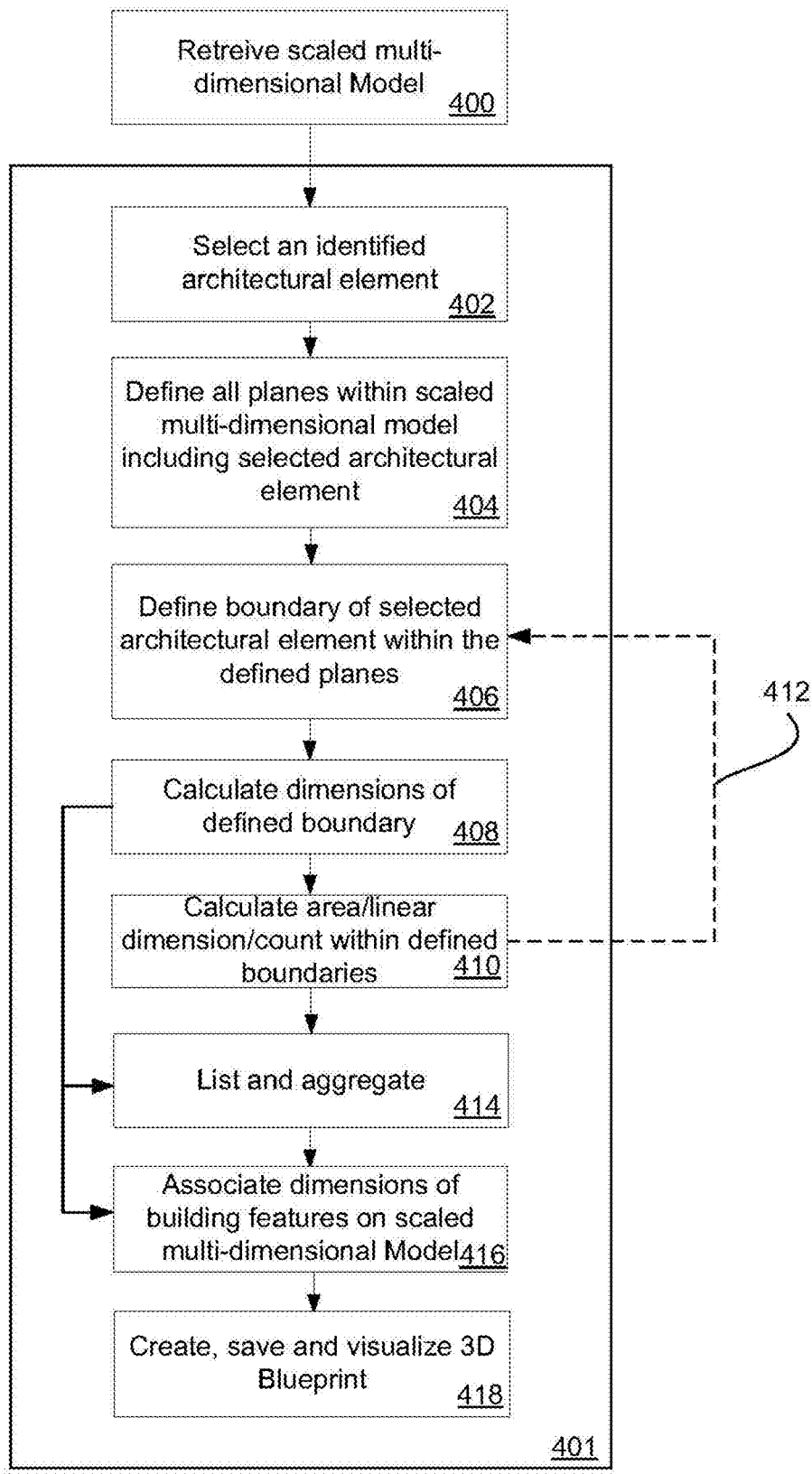
FIG. 4 illustrates another embodiment of a flowchart for identifying various known architectural elements, planes, dimensions and material calculations of a multi-dimensional building model in accordance with the present disclosure.

FIG. 4 illustrates an embodiment of a flowchart for identifying various known architectural elements, planes, dimensions and material/cost calculations of a multi-dimensional building model in accordance with the present disclosure. Once a proper scale is determined for the various surfaces (façades) and architectural elements of the constructed multi-dimensional building model (FIG. 3), each of the surfaces is associated with the calculated dimensions (using known scale and sizes of constructed façades and architectural features (e.g., windows, doors, siding, roofing, paint, brick, stucco, etc.). In one embodiment, the dimensioned multi-dimensional model displays only outlines of the various edges and corners and architectural features with their specific dimensions or labels (sizing/specs reflected in an associated table). In an alternate embodiment, the dimensioned multi-dimensional model is textured using either the ground-level imagery or known default textures (e.g., 6 inch siding, brick, shingle, standard door or window patterns, etc.) with their specific dimensions or labels (sizing reflected in an associated table).

In one embodiment, a complete multi-dimensional (3D) blueprint of a building's exterior includes labeled measurements on the entire multi-dimensional building model exterior, including, but not limited to:

Roof: (e.g., shingle, clay pot, metal, wood, etc.)
roof square footage;
roof measurements (ridges, hips, valleys, rakes, gutters, or eaves): "ridge"—level horizontal line connecting two roof facets along the top edge of their intersection; "hip"—slanted line connecting two roof facets along the top edge of their intersection; "valley"—slanted line connecting two roof facets along the bottom edge of their intersection; "rake"—slanted line along the side of a gable roof facet; and "eave"—level horizontal line along the bottom edge of a roof facet;
Roof pitch
Roof waste
Siding: (vinyl, aluminum, wood, Tudor style, wrap (e.g., Tyvek®), etc.)
Siding square footage
Siding waste
Openings: (width, length, windows and doors quantity, united inches, square footage, tops lengths, sills lengths and sides lengths): "side lengths"—vertical edge line along the intersection of an opening and siding; "sill lengths"—horizontal bottom edge line along the intersection of an opening and siding; "tops lengths"—horizontal top edge line along the intersection of an opening and siding;
Corners: "inside corners" (quantity and length)—vertical line at the intersection of two siding faces; "outside corners" (quantity and length)—vertical line at the intersection of two siding faces;
Starters: "level starter"—bottom of siding that is level where most vinyl contractors use starter strip and most fiber cement contractors use starter strip/first course;
Trim: "sloped trim"—bottom of siding that is sloped where most vinyl contractors use J-channel (ground level) and/or flashing (rooflines) and fiber cement contractors use starter strip/first course; "vertical trim"—a corner where siding meets another substrate; most vinyl contractors use J-channel here and most fiber cement contractors use a trim board; "level base"—level horizontal line along the bottom edge of a siding facet; "sloped base"—slanted line along the bottom edge of a siding facet; "eaves fascia"—length of eaves; "rakes fascia"—length of rakes; "level frieze board"—top of siding that is level and meets roofline; "sloped frieze board"—top of siding that is sloped and meets roofline (gables);
Gutters: length;
Soffit: square footage; width; length
Shutters (quantity and square footage)
Vents (quantity and square footage)
Paint:
Paint square footage
Specific architectural features/elements: (windows, doors, dormers, posts, trim, etc.) features detected, boundaries detected, dimensions calculated, area calculated and material listings and cost estimates calculated Referring again to FIG. 4, in step 400, at least one scaled multi-dimensional model (building) as created, for example in FIG. 3 (element 308), is retrieved from image processing servers 102/112 to calculate and/or identify: overall dimensions, each surface dimension, materials, architectural elements, labels for the identified dimensions, a table of materials and potential costs (estimate/proposal).

In step 402, one or more architectural elements of the ground-level image are selected (e.g., those previously identified—FIG. 3, element 302). Architectural elements can include surfaces, planes, façades, associated façades (e.g., detached garage), etc. In one embodiment, architectural elements are selected on the fly using known image or object recognition techniques, manually (user/modeler selected) or including other known techniques, such as those shown in U.S. application Ser. No. 14/610,850, which is incorporated herein by reference.

In step 404, all planes within the retrieved scaled multi-dimensional model that include the selected architectural element are defined. In step 406, for selected architectural element(s) (in each defined plane), perimeter boundaries for the identified architectural element(s) are defined by correlating, for example, perimeter points, vertices, corner points, edges or specific salient pixels (e.g., neighboring pixels with noted changes in contrast, density or color, side pixels, corner pixels, etc.) of the defined architectural element within the ground-based image to the corresponding boundaries (represented by x, y, z positions) within the 3D building model (e.g., within two images having a common element). Pixel positions are extrapolated from vertices/edges of the ground-level image.

In step 408, dimensions are calculated for the selected architectural features (e.g., windows, doors, siding, roofing, façades and overall dimensions). Using the known scale, dimensions can be calculated geometrically relative to a single anchor point (e.g., front corner of building, window, door, etc.), calculated from multiple anchors points within a single façade/architectural element or within an entire multi-dimensional building model, calculated from a geometric center point/line of the multi-dimensional building model or calculated from a geometric center of a façade or architectural element of the multi-dimensional building model without departing from the scope of the technology described herein. Also, in step 408, once dimensions of each identified architectural element are known, they are passed to a list (step 414), for example, a listing of all window sizes, to be stored in a table within image processing servers 102/112 and further identified within the scaled multi-dimensional model (step 416). However, identification of dimensions can be incrementally performed (e.g., per architectural element, side, surface, etc.) or aggregated (stored in a table within image server memory) and performed together (step 416). Dimensioning can include well-known conventions (e.g., blueprint dimensions) or use specific labels such as letters, numbers or textual labels. As with dimensions, specific labeling can be incrementally performed (e.g., per architectural element (e.g., window), side, surface, etc.) or aggregated (stored in a table within image server memory) and performed later (step 416).

In step 410, using the dimensions from step 406, area is calculated for each architectural element. Area calculations are particularly useful when calculating large surface area elements, such as for siding/paint/brick, where an area of each non-siding surface will need to be removed from an overall calculation of siding surface area. As with step 408, the areas are passed to a listing and aggregation step 414 and labeling step 416. Alternately, an aggregated count of architectural features can be calculated, for example, 8 windows of a certain size, 4 doors of a certain size, 132 foot of gutters, 290 ft of base, 120 ft of rake, 100 ft of fascia, 1600 shingles, etc.

In step 412, the process is repeated for each determined one of the selected architectural element. For example, it is repeated for each window on each façade of the multi-dimensional model.

In step 414, a complete list of all identified architectural features (e.g., materials listing) and calculated dimensions (including area) is defined as well as aggregated total values. For example, the list will identify all windows/doors and their sizes. In another example, roofing total area and other specific roofing components (flashing, cap, etc.) are listed. In yet another example, siding area and specific siding components (inside corner, outside corner, level base, gutters, fascia, etc.) are listed. In addition, as part of, or as an additional step, the listing of materials may be augmented by cross correlation with known pricing lists to create an estimate of costs for the associated items on the list. Basic cost estimating functionality is known in the art. Known methods of calculating costs can be used without departing from the scope of the technology disclosed herein.

In step 418, a 3D blue print with dimensions and/or labels is created. For example, each of the surfaces is labeled with calculated dimensions (using known scale and sizes of constructed façades and architectural features (e.g., windows, doors, siding, roofing, paint, brick, stucco, etc.). In one embodiment, the dimensioned multi-dimensional model displays only outlines of the various edges and corners and architectural features with their specific dimensions or labels (sizing reflected in an associated table). In an alternate embodiment, the dimensioned multi-dimensional model is textured using either the ground-level imagery or known default textures (e.g., 6 inch siding, brick, shingle, standard door or window patterns, etc.) with their specific dimensions or labels reflected in an associated table.

The 3D blueprint can, in one embodiment, be returned to the capture device (e.g., smartphone) to be electronically displayed to the user or be displayed to a potential homeowner as part of a remodeling or repair proposal (estimate). In addition, the lists can be provided (communicated/displayed/stored) in association, or separately, from the 3D model and can be organized by material, architectural feature, sizing, costs, remodeling schedule (date of installation), etc.

Figure 5:
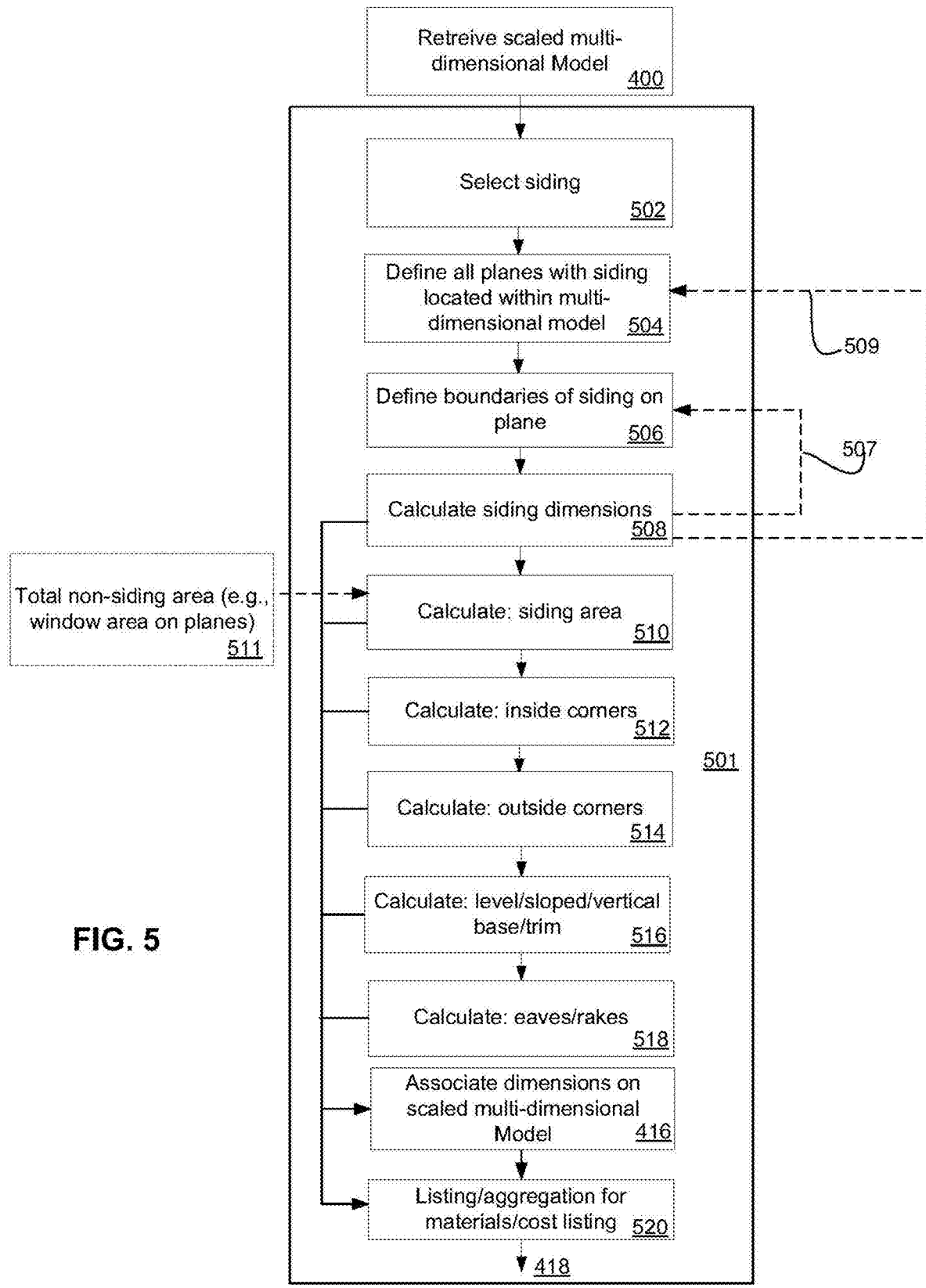
FIG. 5 illustrates another embodiment of a flowchart for identifying various known architectural elements, façades and dimensions of a multi-dimensional building model in accordance with the present disclosure.

FIG. 5 illustrates an embodiment of a flowchart for identifying planes with siding, dimensions (area) and material/cost calculations for a multi-dimensional building model in accordance with the present disclosure. In step 500, at least one scaled multi-dimensional model (building) as created, for example in FIG. 3 (element 308), is retrieved from image processing servers 102/112 to calculate and/or identify: overall dimensions, each surface dimension, siding material, non-siding architectural elements, labels for the identified dimensions, a table of materials and potential costs (estimate/proposal).

In step 502, siding as an architectural element is selected. In one embodiment, siding is selected on the fly using known image or object recognition techniques, manually (user/modeler selected) or including other known techniques, such as those shown in U.S. application Ser. No. 14/610,850, which is incorporated herein by reference.

In step 504, all planes within the retrieved scaled multi-dimensional model that include siding are defined. In step 506, for each defined plane with siding (repeated 507), perimeter boundaries for the siding are defined by correlating, for example, perimeter points, vertices, corner points, edges or specific salient pixels (e.g., neighboring pixels with noted changes in contrast, density or color, side pixels, corner pixels, etc.) of the siding within the ground-based image to the corresponding boundaries (represented by x, y, z positions) within the 3D building model (e.g., within two images having a common element). Pixel positions are extrapolated from vertices/edges of the ground-level imagery.

In step 508, siding dimensions for each plane with siding are calculated. Using the known scale, dimensions can be calculated geometrically relative to a single anchor point (e.g., front corner of building), calculated from multiple anchors points within a single façade or within an entire multi-dimensional building model, calculated from a geometric center point/line of the multi-dimensional building model or calculated from a geometric center of a façade or siding area of the multi-dimensional building model without departing from the scope of the technology described herein. Also, in step 508, once dimensions of each identified plane with siding are known (repeated in step 509), they are passed to a list (step 520), for example, a listing of all siding areas, to be stored in a table within image processing servers 102/112 and further identified within the scaled multi-dimensional model (FIG. 4, element 418). However, identification of dimensions can be incrementally performed (e.g., per architectural element, side, surface, etc.) or aggregated (stored in a table within image server memory) and performed together (FIG. 4, step 416). Dimensioning can use well-known conventions (e.g., blueprint dimensions) or use specific labels such as letters, numbers or textual labels. As with dimensions, specific labeling can be incrementally performed (e.g., per architectural element side, surface, etc.) or aggregated (stored in a table within image server memory) and performed later (FIG. 4, step 416).

In step 510, using the dimensions from step 508, area is calculated for each plane with siding. In addition, area calculations of identified non-siding elements, step 511, (e.g., are particularly useful when calculating this type of large surface area element, where an area of each non-siding surface (e.g., windows/doors) will need to be removed from an overall calculation of the total siding surface area. As with step 508, the areas calculated are passed to an aggregation step 520 and label step (FIG. 4, step 416).

Figure 7:
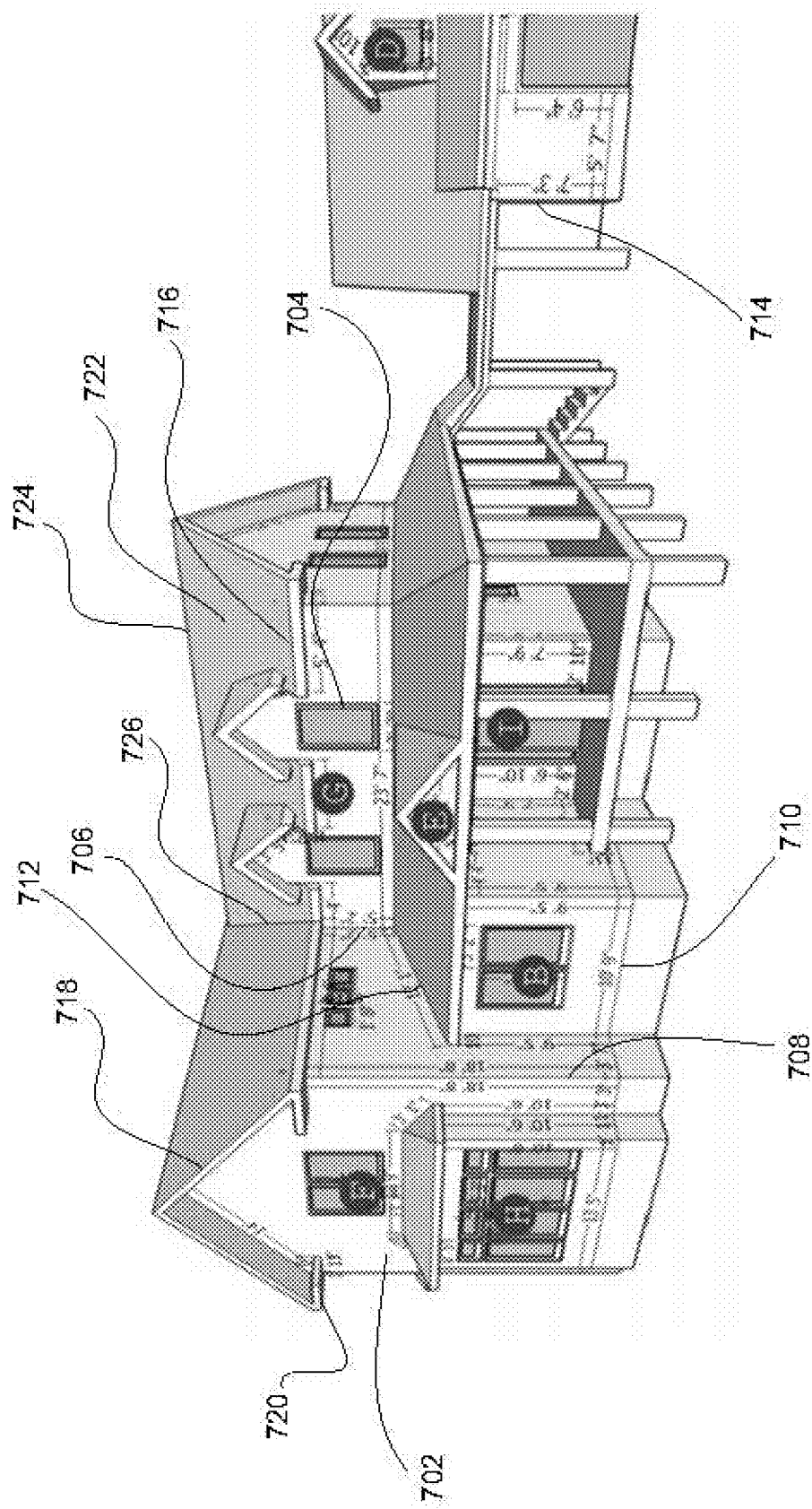
FIG. 7 illustrates an embodiment of a diagram identifying various known architectural elements, façades and dimensions of a multi-dimensional building model in accordance with the present disclosure.

In steps 512-518, associated siding components (inside corners, outside corners, level base, gutters, fascia, etc.) are determined (i.e., detected using known image recognition techniques or manually noted and dimensions calculated). FIG. 7 and associated descriptions provide greater detail on siding specific features. In step 512, inside corners are identified, dimensions retrieved from step 508 and the total length of inside corner material needed for each façade is aggregated and totaled in step 520. Inside corners represent vertical lines at the inner intersection of two siding faces. Inside corners, of the length of the vertical lines, will be used to cover siding intersecting at the inside corners.

In step 514, outside corners are identified, dimensions retrieved from step 508 and the total length of outside corner material needed for each façade is aggregated and totaled in step 520. Outside corners represent vertical lines at the outer intersection of two siding faces. Outside corners, of the length of the vertical lines, will be used to cover siding intersecting at the outer corners.

In step 516, level or sloped base or sloped or vertical trim is identified, dimensions retrieved from step 508 and the total length of level, sloped or vertical base/trim material needed for each façade is aggregated and totaled in step 520. Level base represents a bottom of the siding that is level where most vinyl contractors use starter strip and most fiber cement contractors use starter strip/first course. Sloped base/trim represents a bottom of the siding that is sloped where most vinyl contractors use J-channel (ground level) and/or flashing (rooflines) and fiber cement contractors use starter strip/first course. Vertical trim represents a corner where siding meets another substrate; most vinyl contractors use J-channel here and most fiber cement contractors use a trim board. In addition, this step can include calculation and aggregation of level frieze board, the top of siding that is level meets roofline, sloped frieze board, the top of siding that is sloped meets roofline (gables).

In step 518, eaves and rakes are identified, dimensions retrieved from step 508 and the total length of eaves and rakes material needed for each façade is aggregated and totaled in step 520. Eaves, also referred to as eaves fascia, represent length of eaves. Rakes, also referred to as rakes fascia, represent length of rakes.

Other associated siding materials that may be replaced during a siding replacement include, but are not limited to, gutters (length), soffit (square footage), shutters (quantity and square footage), and vents (quantity and square footage). Each of these associated siding materials can be calculated using one or more of the steps 502-508 and 520.

In step 520, a complete list of all identified siding areas and associated siding elements (materials listing) with calculated dimensions (including area) are stored (e.g., in table form) including aggregated total values. For example, the list will identify all siding and associated elements needed to re-side the building represented by the multi-dimensional model. In addition, as part of, or as an additional step, the listing of materials may be augmented by cross correlation with known pricing lists to create an estimate of costs for the associated items on the list. Basic cost estimating functionality is known in the art. Known methods of calculating costs can be used without departing from the scope of the technology disclosed herein.

Referring back to step 418 (FIG. 4), a 3D blue print with dimensions and/or labels is created. For example, each of the surfaces is labeled with calculated dimensions (using known scale and sizes of constructed façades and siding and associated siding elements. In one embodiment, the dimensioned multi-dimensional model displays only outlines of the various edges and corners and architectural features with their specific dimensions or labels (sizing reflected in an associated table). In an alternate embodiment, the dimensioned multi-dimensional model is textured using either the ground-level imagery or known default textures (e.g., 6 inch siding) with their specific dimensions or labels (sizing reflected in an associated table). The 3D blueprint can, in one embodiment be returned to the capture device (e.g., smartphone) to be displayed to the user or be displayed to a potential homeowner as part of a remodeling or repair proposal (estimate). In addition, the lists can be provided (communicated/displayed/stored) in association, or separately, from the 3D model and can be organized by material, architectural feature, sizing, costs, etc.

Figure 6:
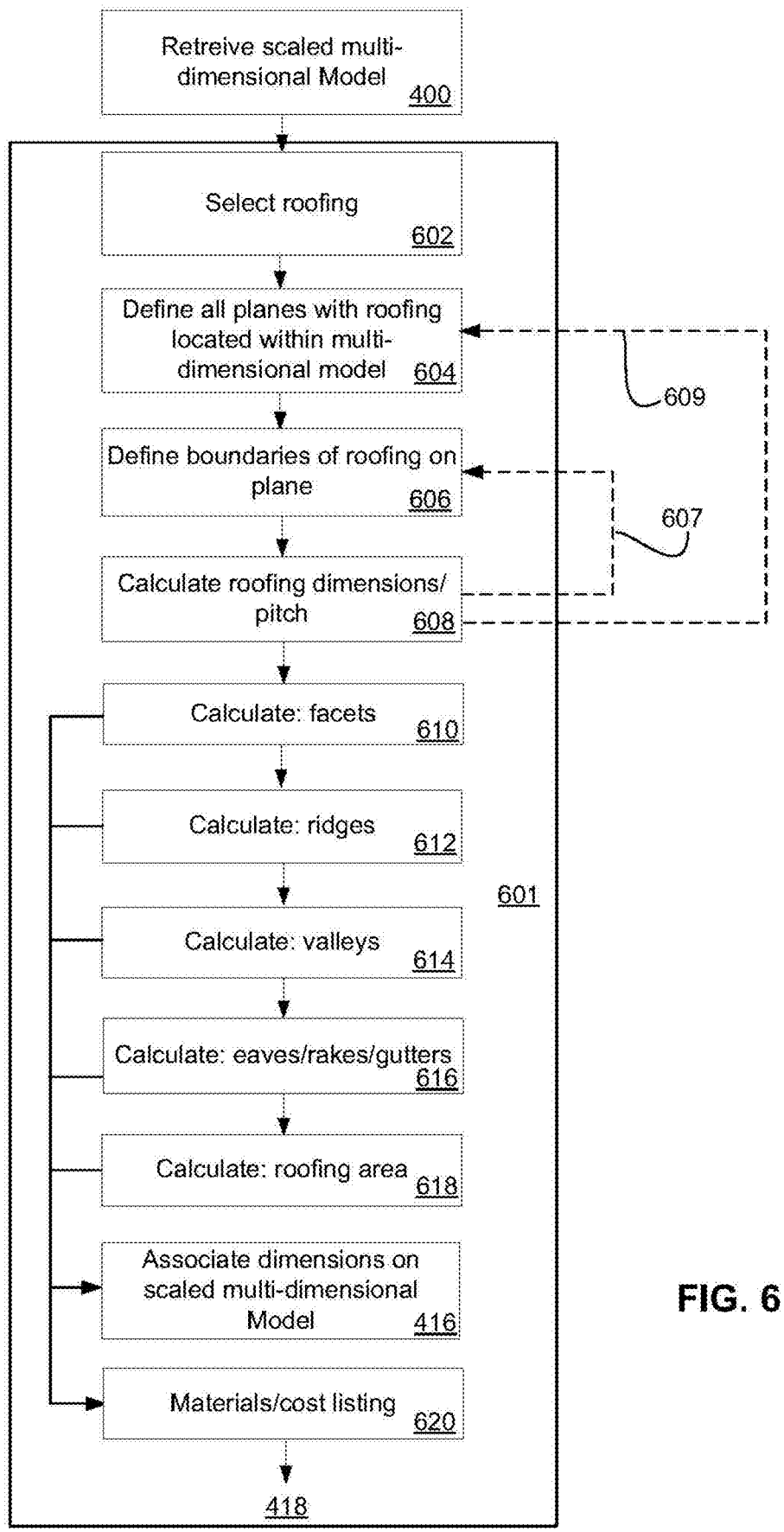
FIG. 6 illustrates another embodiment of a diagram identifying various known architectural elements, façades and dimensions of a multi-dimensional building model in accordance with the present disclosure.

FIG. 6 illustrates an embodiment of a flowchart for identifying planes with roofing, dimensions (area) and material/cost calculations for a multi-dimensional building model in accordance with the present disclosure. In step 600, at least one scaled multi-dimensional model (building) as created, for example in FIG. 3 (element 308), is retrieved from image processing servers 102/112 to calculate and/or identify: overall dimensions, each surface dimension, roofing material, associated roofing materials and associated non-roofing architectural elements (e.g., skylights, chimneys, etc.), labels for the identified dimensions, a table of materials and potential costs (estimate/proposal).

In step 602, roofing as an architectural element is selected. In one embodiment, roofing is selected on the fly using known image or object recognition techniques, manually (user/modeler selected) or including other known techniques, such as those shown in U.S. application Ser. No. 14/610,850, which is incorporated herein by reference.

In step 604, all planes within the retrieved scaled multi-dimensional model that include roofing are defined. In step 606, for each defined plane with roofing (repeated for each defined plane (607), perimeter boundaries for the roofing are defined by correlating, for example, perimeter points, vertices, corner points, edges or specific salient pixels (e.g., neighboring pixels with noted changes in contrast, density or color, side pixels, corner pixels, etc.) of the roofing within the building object imagery (e.g., ground-based image) to the corresponding boundaries (represented by x, y, z positions) within the 3D building model (e.g., within two images having a common element). Pixel positions are extrapolated from vertices/edges of the ground-level imagery.

In step 608, roofing dimensions including pitch for each plane with roofing are calculated. Using the known scale, dimensions can be calculated geometrically relative to a single anchor point (e.g., peak (highest point) of building), calculated from multiple anchors points within a single façade or within an entire multi-dimensional building model (e.g. each peak), calculated from a geometric center point/line of the multi-dimensional building model or calculated from a geometric center of a façade or roofing area of the multi-dimensional building model without departing from the scope of the technology described herein. Also, in step 608, once dimensions of each identified plane with roofing are known (repeated in step 609), they are passed to a list (step 620), for example, a listing of all roofing areas, to be stored in a table within image processing servers 102/112 and further identified within the scaled multi-dimensional model (FIG. 4, element 418). However, identification of dimensions can be incrementally performed (e.g., per architectural element, side, surface, etc.) or aggregated (stored in a table within image server memory) and performed together (FIG. 4, step 416). Dimensioning can use well-known conventions (e.g., blueprint dimensions) or use specific labels such as letters, numbers or textual labels. As with dimensions, specific labeling can be incrementally performed (e.g., per architectural element side, surface, etc.) or aggregated (stored in a table within image server memory) and performed later (FIG. 4, step 416).

Figure 13:
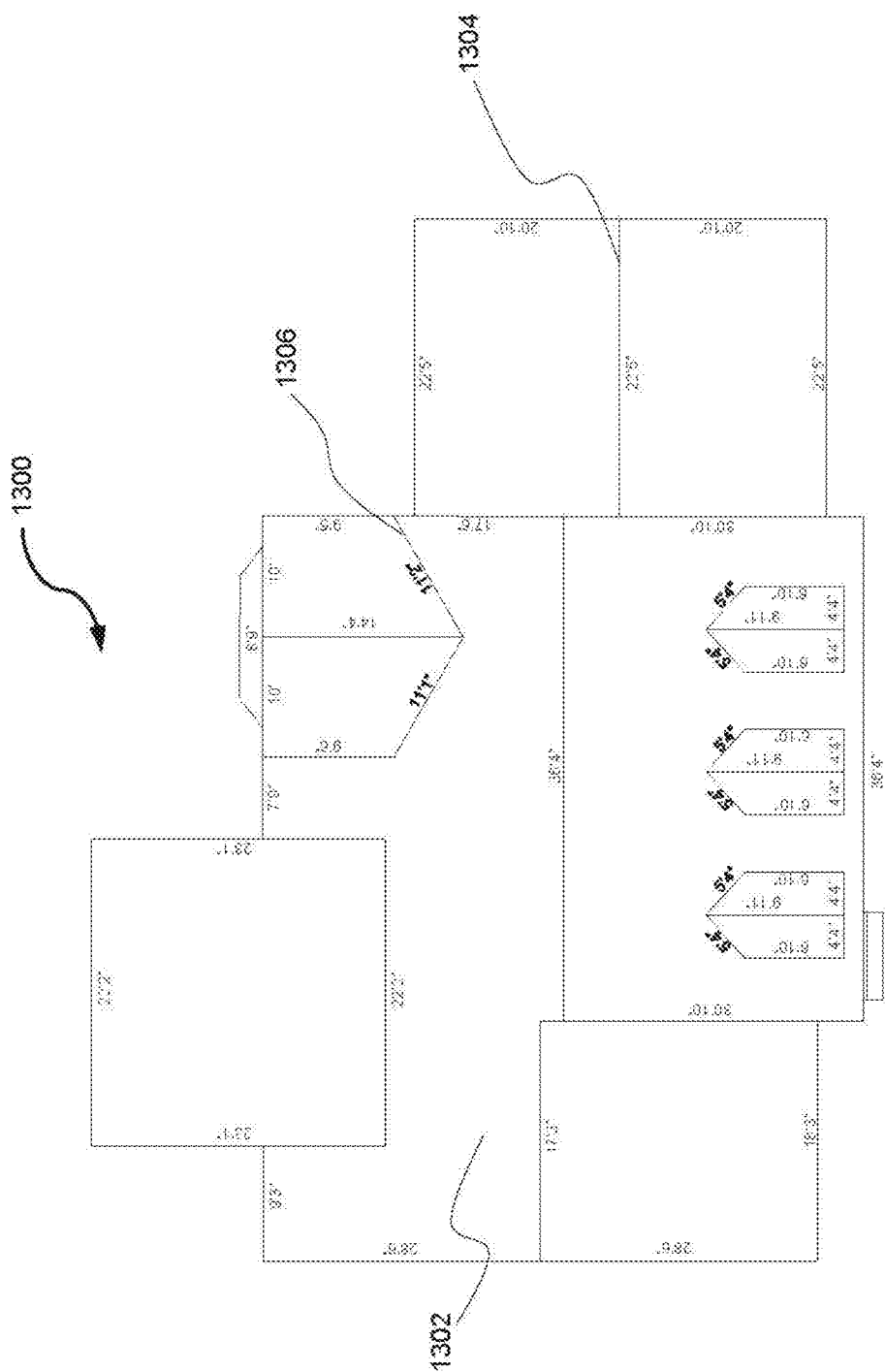
FIG. 13 illustrates an embodiment of a roofing diagram for identified various known architectural elements and dimensions of a multi-dimensional building model in accordance with the present disclosure.

In addition, area calculations of identified non-roofing elements can be included in steps 602-608 (where non-roofing architectural elements in roofing areas are selected and areas calculated) where an area of each non-roofing surface (e.g., skylights vents, chimneys, etc.) will need to be removed from an overall calculation of the total roofing surface area. FIGS. 7 and 13 and associated descriptions provide greater detail on roofing specific features. As with step 608, the areas calculated are passed to an aggregation step 620 and label step (FIG. 4, step 416).

In steps 610-618, roofing areas and associated roofing components (eaves, rakes, gutters, fascia, etc.) are determined (i.e., detected and dimensions calculated). In step 610, facets of the roof are identified, dimensions retrieved from step 608 and the total facet area roofing material needed for each facet is aggregated and totaled in step 620. Facets represent each face at the inner intersection of two roofing faces.

In step 612, ridges of the roof are identified, dimensions retrieved from step 608 and the total ridge area roofing material (e.g., shingles and ridge venting) needed for each ridge is aggregated and totaled in step 620. Ridges represent material covering an upper intersection of two roofing faces.

In step 614, valleys of the roof are identified, dimensions retrieved from step 608 and the total valley area roofing material needed for each valley is aggregated and totaled in step 620. Valleys represent material covering an inner (lower/sloped) intersection of two roofing faces.

In step 616, eaves/rakes/gutters/fascia are identified, dimensions retrieved from step 608 and the total length of eaves/rakes/gutters/fascia material needed for each façade is aggregated and totaled in step 620. Eaves, also referred to as eaves fascia, represent length of eaves. Rakes, also referred to as rakes fascia, represent length of rakes. Gutters run along fascia and may include downspout length calculations (vertical corner edges of façades).

In step 618, each of the roofing areas are calculated, aggregated in step 622 and identified in step 418 (FIG. 4).

Other associated roofing materials that may be replaced during a roofing replacement include, but are not limited to, tar paper (square footage), flashing (lengths and square footage), plywood sheathing, drip edge, felt underlayment, frieze board, and vents (quantity and square footage). Each of these associated roofing materials can be calculated using one or more of the steps 602-608 and 620.

In step 620, a complete list of all identified roofing areas and associated roofing elements (materials listing) with calculated dimensions (including pitch and area) are stored (e.g., in table form) including aggregated total values. For example, the list will identify all roofing and associated elements needed to re-roof the building represented by the multi-dimensional model. In addition, as part of, or as an additional step, the listing of materials may be augmented by cross correlation with known pricing lists to create an estimate of costs for the associated items on the list. Basic cost estimating functionality is known in the art. Known methods of calculating costs can be used without departing from the scope of the technology disclosed herein.

Referring back to step 418 (FIG. 4), a 3D blue print with dimensions and/or labels is created. For example, each of the roofing surfaces is labeled with calculated dimensions, including pitch, (using known scale and sizes of constructed façades and roofing and associated roofing elements. In one embodiment, the dimensioned multi-dimensional model displays only outlines of the various edges and corners and architectural features with their specific dimensions or labels (sizing reflected in an associated table). In an alternate embodiment, the dimensioned multi-dimensional model is textured using either the ground-level imagery or known default textures (e.g., asphalt shingles) with their specific dimensions or labels (sizing reflected in an associated table). The 3D blueprint can, in one embodiment be returned to the capture device (e.g., smartphone) to be displayed to the user or be displayed to a potential homeowner as part of a remodeling or repair proposal (estimate). In addition, the lists can be provided (communicated/displayed/stored) in association, or separately, from the 3D model and can be organized by material, architectural feature, sizing, costs, etc.

Throughout the specification, drawings and claims, the technology has been described for scaling; however, the same technology and methodologies can be used to provide rescaling (e.g., a multi-dimensional model with poor (errors) original scaling, such as ortho-based) without departing from the scope of the technology described herein. In addition, the various embodiments may be interchangeably implemented before, during or after construction of the multi-dimensional model. In addition, all dimensions all shown in inches, may interchangeably use metric sizing. Also, known standard architectural dimensional ratios can be customized by geographic location. For example, a brick size may be different in Europe vs. the United States. And lastly, known standard architectural dimensional ratios can be selected from groups based on building style (Georgian, saltbox, colonial, etc.).

FIG. 7 illustrates an embodiment of a diagram identifying various known architectural elements, façades and dimensions of a multi-dimensional building model in accordance with the present disclosure. As shown, a three-dimensional building model includes labeled architectural features, such as windows (B, D, F and H), and façade measurements. Element 702 represents a front façade. Element 704 represents a window. Element 706 represents an inside corner. Element 708 represents an outside corner. Element 710 represents a level base (starter base). Element 712 represents a sloped base. Element 714 represents a vertical trim. Element 716 represents a fascia/gutter. Element 718 represents a sloped trim/rake. Element 720 represents an eave. Element 722 represents a roof facet. Element 724 represents a roof ridge. Element 726 represents a roof valley.

Figure 8:
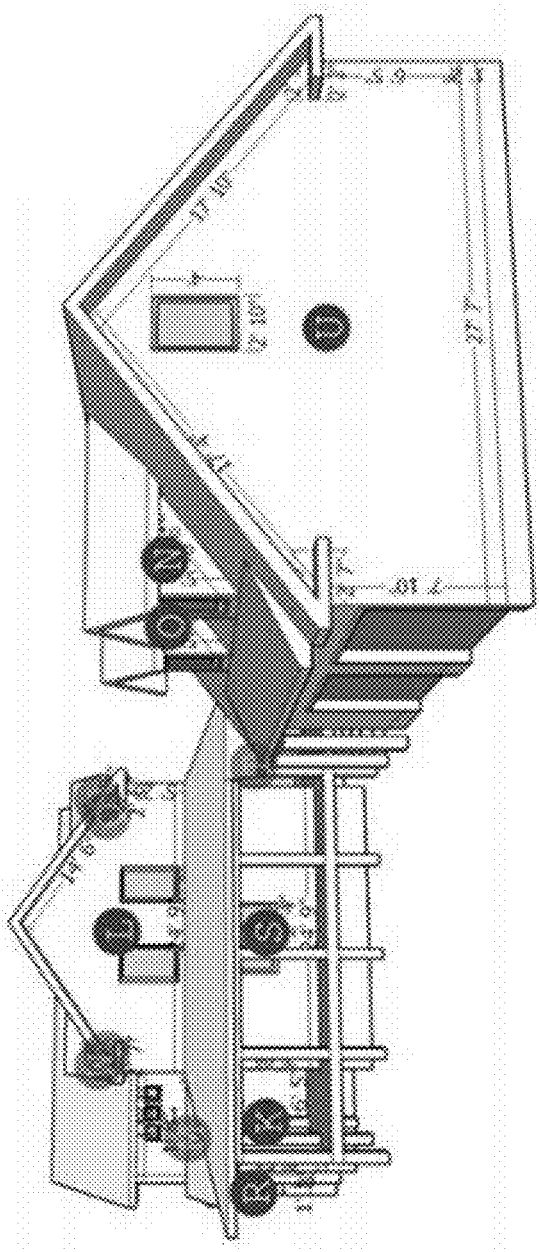
FIG. 8 illustrates another embodiment of a diagram identifying various known architectural elements, façades and dimensions of a multi-dimensional building model in accordance with the present disclosure.

FIG. 8 illustrates an embodiment of a diagram identifying various known architectural elements, façades and dimensions of a multi-dimensional building model in accordance with the present disclosure. FIG. 8 represents a right-hand view of a same three-dimensional building model including labeled architectural features as shown in FIG. 7.

Figure 9:
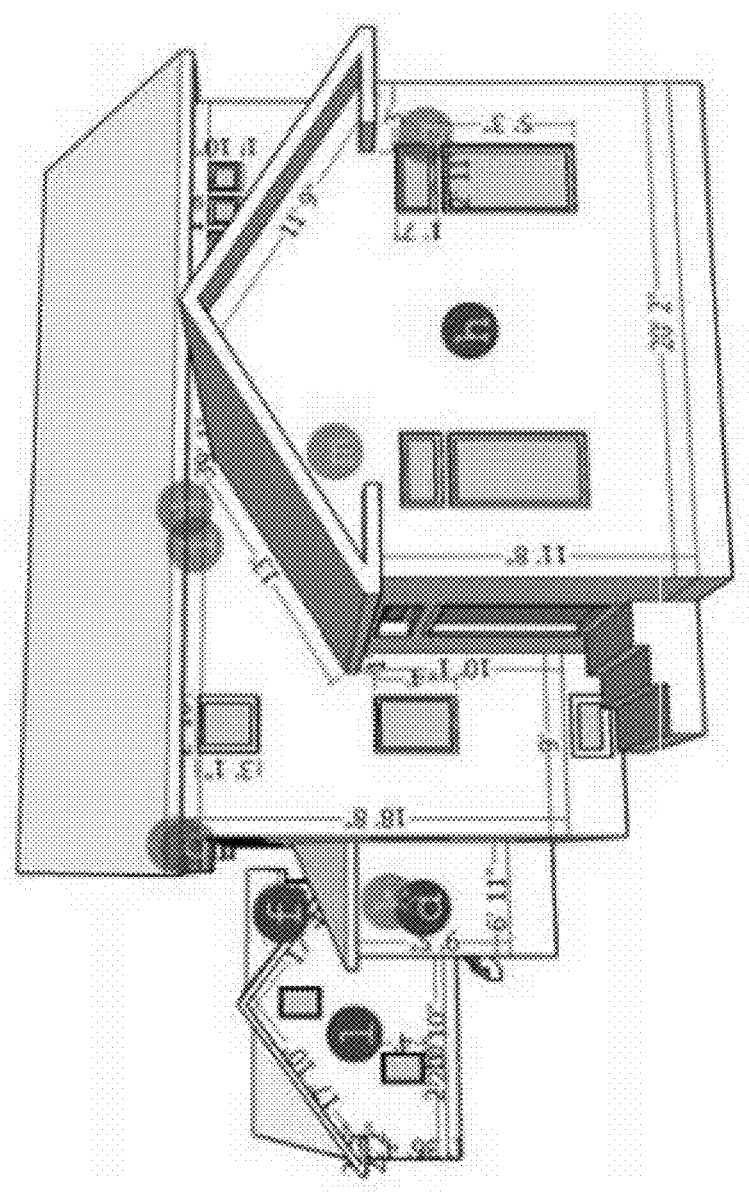
FIG. 9 illustrates another embodiment of a diagram identifying various known architectural elements, façades and dimensions of a multi-dimensional building model in accordance with the present disclosure.

FIG. 9 illustrates an embodiment of a diagram identifying various known architectural elements, façades and dimensions of a multi-dimensional building model in accordance with the present disclosure. FIG. 9 represents a rear view of the same three-dimensional building model including labeled architectural features as shown in FIG. 7.

FIG. 10 illustrates an embodiment of a siding table (materials listing) for identified various known siding architectural elements, façades and areas of a multi-dimensional building model in accordance with the present disclosure. As shown, siding areas of various façades as calculated and labeled on the multi-dimensional building model are listed. Also, included are quantities of inside and outside corners needed as well as windows and shutters on each façade.

Figure 11:
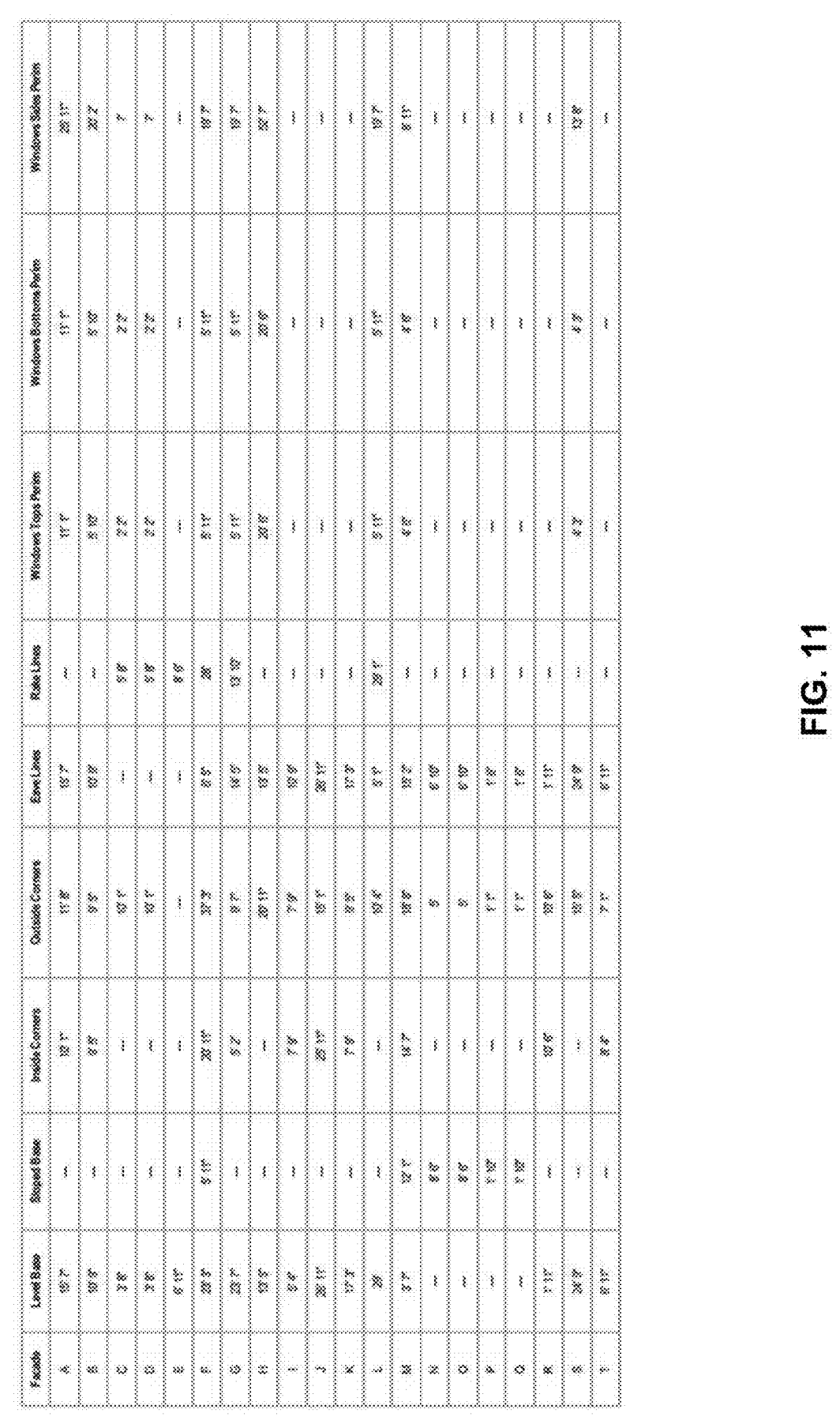

FIG. 11 illustrates an embodiment of a detailed siding listing of materials/dimensions for identified various known architectural elements, façades and dimensions of a multi-dimensional building model in accordance with the present disclosure. As shown, associated siding materials of various façades as calculated and labeled on the multi-dimensional building model are listed. These associated siding materials and their aggregated quantities (per façade) are, but not limited to, level base, sloped base, inside corners, outside corners, eave lines, rake lines, and various window perimeters.

FIG. 12 illustrates an embodiment of an aggregated siding listing for identified various known architectural elements, façades and dimensions of a multi-dimensional building model in accordance with the present disclosure. As shown, total quantities, lengths and areas are listed.

FIG. 13 illustrates an embodiment of a roofing diagram for identified various known architectural elements and dimensions of a multi-dimensional building model in accordance with the present disclosure. As shown, various sections of a roof are shown as part of the top view 1300 of a multi-dimensional building model. Element 1302 represents facets of the roofing. Element 1304 represents ridges of the roofing. Element 1306 represents valleys of the roofing.

Figure 14:
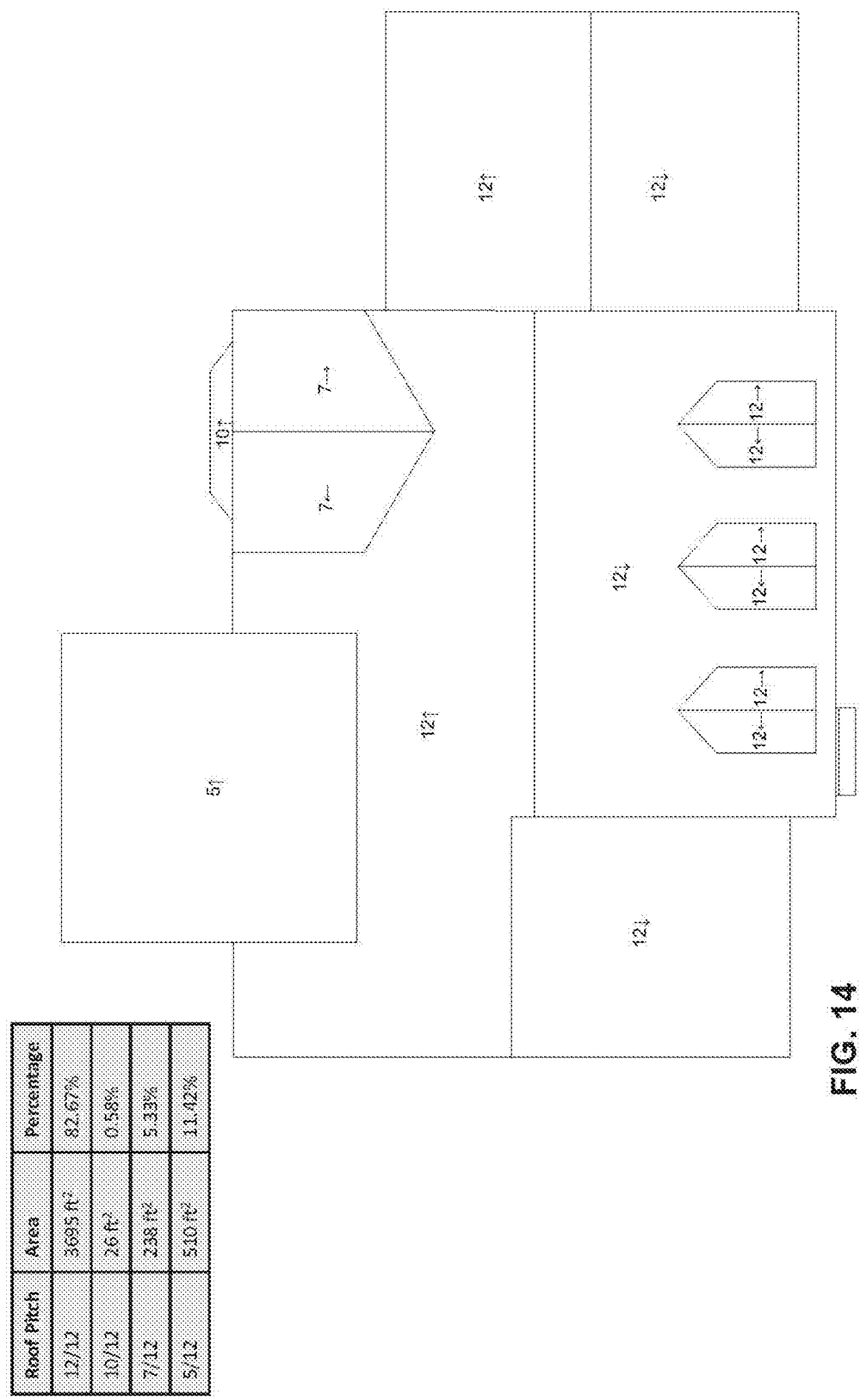
FIG. 14 illustrates an embodiment of a roofing diagram for identified various known architectural elements and dimensions of a multi-dimensional building model in accordance with the present disclosure.

FIG. 14 illustrates an embodiment of a roofing diagram/listing for identified various known architectural elements and dimensions of a multi-dimensional building model in accordance with the present disclosure. As shown, the listing includes roofing sections with various pitches, area and percentage of total roof area. A labeled diagram shows a location of the various pitch areas.

Figure 15:
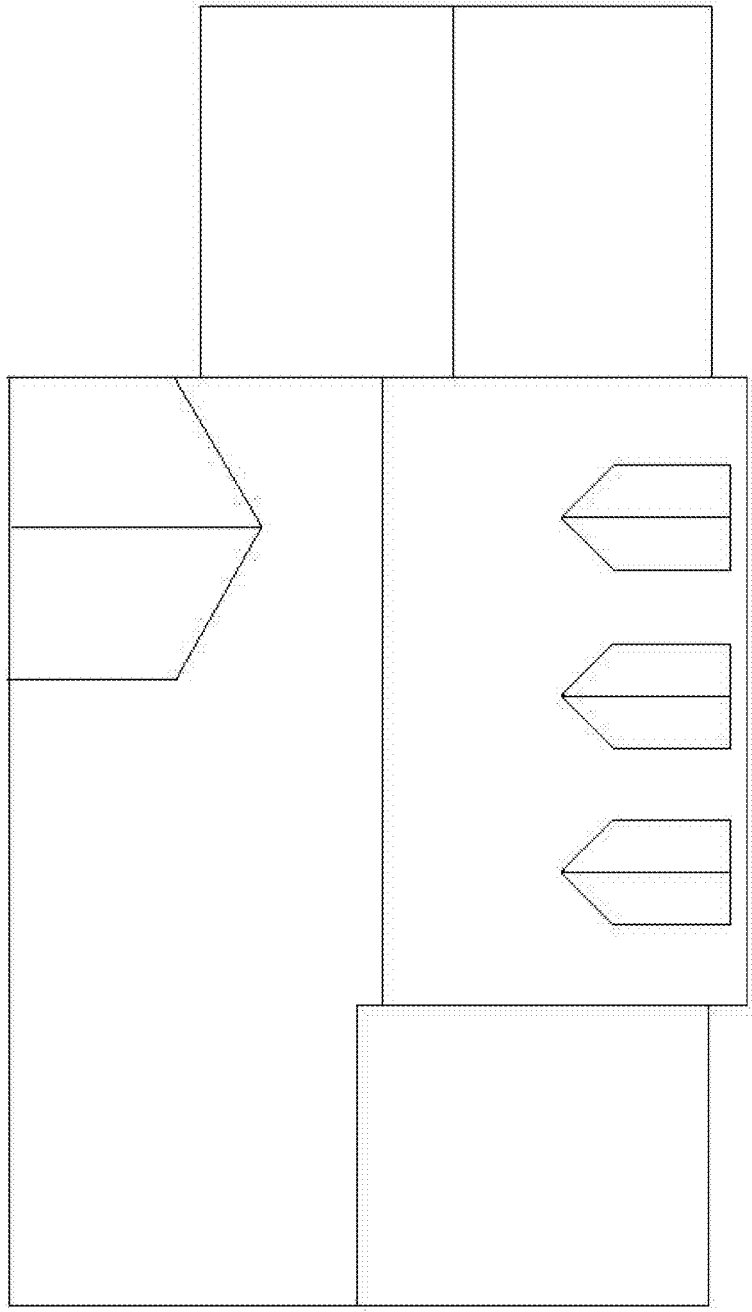
FIG. 15 illustrates an embodiment of a summary roofing listing for identified various known architectural elements and dimensions of a multi-dimensional building model in accordance with the present disclosure.

FIG. 15 illustrates an embodiment of an aggregated roofing listing for identified various roofing areas and associated roofing elements and dimensions thereof from a multi-dimensional building model in accordance with the present disclosure. As shown, the listing shows an aggregation of: facets (number and square area), ridges/hips (number/length), valleys (number/length), rakes (number/length) and gutters/eaves (number/length).

Figure 16:
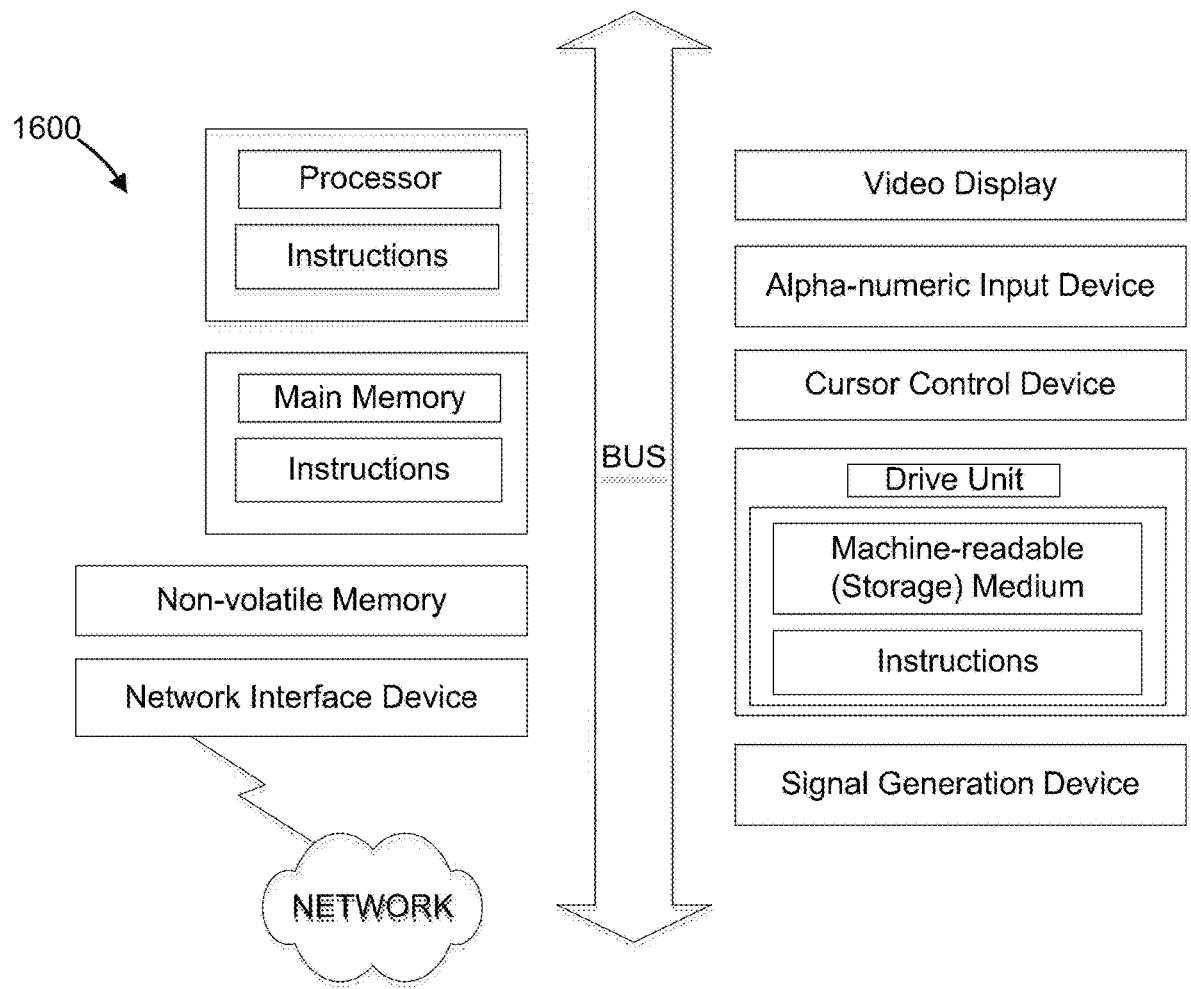
FIG. 16 illustrates a diagrammatic representation of a machine in the example form of a computer system in accordance with the present disclosure.

Referring now to FIG. 16, therein is shown a diagrammatic representation of a machine in the example form of a computer system 1600 within which a set of instructions, for causing the machine to perform any one or more of the methodologies or modules discussed herein, may be executed. Computer system 1600 includes a processor, memory, non-volatile memory, and an interface device. Various common components (e.g., cache memory) are omitted for illustrative simplicity. The computer system 1600 is intended to illustrate a hardware device on which any of the components depicted in the example of FIG. 1 (and any other components described in this specification) can be implemented. The computer system 1600 can be of any applicable known or convenient type. The components of the computer system 1600 can be coupled together via a bus or through some other known or convenient device.

This disclosure contemplates the computer system 1600 taking any suitable physical form. As example and not by way of limitation, computer system 1600 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 1600 may include one or more computer systems 1600; be unitary or distributed; span multiple locations; span multiple machines; or reside in a cloud, which may include one or more cloud components in one or more networks. Where appropriate, one or more computer systems 1600 may perform without substantial spatial or temporal limitation one or more steps of one or more methods described or illustrated herein. As an example and not by way of limitation, one or more computer systems 1600 may perform in real time or in batch mode one or more steps of one or more methods described or illustrated herein. One or more computer systems 1600 may perform at different times or at different locations one or more steps of one or more methods described or illustrated herein, where appropriate.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer system 1600. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system 1200. The interface can include an analog modem, isdn modem, cable modem, token ring interface, satellite transmission interface (e.g., "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted reside in the interface.

In operation, the computer system 1600 can be controlled by operating system software that includes a file management system, such as a disk operating system. One example of operating system software with associated file management system software is the family of operating systems known as Windows® from Microsoft Corporation of Redmond, Washington, and their associated file management systems. Another example of operating system software with its associated file management system software is the Linux™ operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

In one embodiment, known standard measurements, for example a height from a door threshold to the center of a door knob is used to scale the 3D building model. In addition, the scaling can be determined using any known standard measurement located within a captured image (building object imagery). Also, the scaling can be determined using any known standard dimensional ratio measurement located within a captured image. And finally, the scaling can be determined using any known dimensional measurement located within a field of view of a captured image.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While particular combinations of various functions and features of the technology as described herein have been expressly described herein, other combinations of these features and functions are likewise possible. For example, the steps may be completed in varied sequences to complete the textured façades. The technology as described herein is not limited by the particular examples disclosed herein and expressly incorporates these other combinations.

What is claimed is:

1. A method of creating a multi-dimensional model comprising:
    identifying a plurality of architectural elements within building object imagery;
    constructing the multi-dimensional model from the building object imagery based on the plurality of architectural elements;
    comparing a dimension value of a first identified architectural element of the plurality of architectural elements to an externally referenced architectural element dimension;
    applying the externally referenced architectural element dimension to the first identified architectural element;
    validating a scaling factor for the multi-dimensional building model according to a relative error of a second architectural element of the plurality of architectural elements, the relative error resulting from the externally referenced architectural element dimension applied to the first architectural element;
    scaling the multi-dimensional model based on the scaling factor; and
    providing dimensions of a plurality of features of the scaled multi-dimensional model.

2. The method of claim 1, wherein identifying the plurality of architectural elements comprises using object recognition techniques to identify the plurality of architectural elements.

3. The method of claim 1, wherein the plurality of architectural elements are within planar surfaces of the building object imagery.

4. The method of claim 1, further comprising receiving the dimension value of the first identified architectural element.

5. The method of claim 1, further comprising detecting the dimension value of the first identified architectural element.

6. The method of claim 1, wherein the dimension value of the first identified architectural element comprises a dimensional ratio.

7. The method of claim 1, wherein comparing the dimension value of the first identified architectural element to the externally referenced architectural element dimension is based on a closest dimension.

8. The method of claim 1, wherein comparing the dimension value of the first identified architectural element to the externally referenced architectural dimension comprises matching the dimension value of the first identified architectural element to the externally referenced architectural element dimension.

9. The method of claim 8, wherein matching the dimension value of the first identified architectural element to the externally referenced architectural element dimension comprises matching within a threshold.

10. The method of claim 9, wherein the threshold is ninety-five percent.

11. The method of claim 1, wherein the relative error is less than five percent.

12. The method of claim 1, wherein the dimension value of the first identified architectural element is a dimensional ratio of the first identified architectural element, and wherein the externally referenced architectural element dimension is an externally referenced architectural element dimensional ratio.

13. The method of claim 1, wherein applying the externally referenced architectural element dimension further comprises scaling the building object imagery based on the externally referenced architectural element dimension.

14. The method of claim 1, wherein applying the externally referenced architectural element dimension further comprises scaling the multi-dimensional building model based on the externally referenced architectural element dimension.

15. The method of claim 1, wherein the multi-dimensional model is a 2D building model.

16. The method of claim 1, wherein the multi-dimensional model is a 3D building model.

17. The method of claim 1, wherein the plurality of features comprises a plurality of architectural features.

18. Non-transitory computer storage media storing instructions that when executed by a system comprising one or more processors, cause the one or more processors to perform operations comprising:
 identifying a plurality of architectural elements within building object imagery;
 constructing the multi-dimensional model from the building object imagery based on the plurality of architectural elements;
 comparing a dimension value of a first identified architectural element of the plurality of architectural elements to an externally referenced architectural element dimension;
 applying the externally referenced architectural element dimension to the first identified architectural element;
 validating a scaling factor for the multi-dimensional building model according to a relative error of a second architectural element of the plurality of architectural elements, the relative error resulting from the externally referenced architectural element dimension applied to the first architectural element;
 scaling the multi-dimensional model based on the scaling factor; and
 providing dimensions of a plurality of features of the scaled multi-dimensional model.

19. The non-transitory computer storage media of claim 18, wherein comparing the dimension value of the first identified architectural element to the externally referenced architectural dimension comprises matching the dimension value of the first identified architectural element to the externally referenced architectural element dimension.

20. The non-transitory computer storage media of claim 19, wherein matching the dimension value of the first identified architectural element to the externally referenced architectural element dimension comprises matching within a threshold.

* * * * *